US007042138B2

(12) United States Patent
Yokoi et al.

(10) Patent No.: US 7,042,138 B2
(45) Date of Patent: May 9, 2006

(54) PIEZOELECTRIC ACOUSTIC TRANSDUCER

(75) Inventors: Yuko Yokoi, Toyama-ken (JP); Kiyotaka Tajima, Toyama (JP); Manabu Sumita, Toyama (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 10/764,568

(22) Filed: Jan. 27, 2004

(65) Prior Publication Data

US 2004/0201326 A1 Oct. 14, 2004

(30) Foreign Application Priority Data

Apr. 10, 2003 (JP) ............................ 2003-106036

(51) Int. Cl.
*H01L 41/08* (2006.01)

(52) U.S. Cl. ....................... 310/324; 310/330; 310/348

(58) Field of Classification Search ................ 310/322, 310/324, 330–332, 340, 344, 348
See application file for complete search history.

(56) References Cited

U.S. PATENT DOCUMENTS

| | | | | |
|---|---|---|---|---|
| 5,632,841 A * | 5/1997 | Hellbaum et al. | .......... | 156/245 |
| 6,744,180 B1 * | 6/2004 | Nakamura et al. | .......... | 310/348 |
| 6,797,799 B1 | 9/2004 | Takeshima et al. | | |

FOREIGN PATENT DOCUMENTS

| | | |
|---|---|---|
| DE | 1 760 407 U | 1/1958 |
| DE | 102 33 413 A1 | 3/2003 |
| JP | 61-030898 | 2/1986 |
| JP | 2001-095094 | 4/2001 |
| JP | 2002-010393 | 1/2002 |

OTHER PUBLICATIONS

Official Communication dated Oct. 10, 2005, issued in the corresponding German Application Number 10 2004 007 247.7-35 (with full English translation).

* cited by examiner

*Primary Examiner*—Mark Budd
(74) *Attorney, Agent, or Firm*—Keating & Bennett, LLP

(57) ABSTRACT

A piezoelectric type electroacoustic transducer includes a piezoelectric vibrating plate including a plurality of piezoelectric ceramic layers laminated to each other with an internal electrode being interposed between the piezoelectric ceramic layers, and main surface electrodes disposed on the main surfaces on the front and back sides of the piezoelectric vibrating plate, whereby the piezoelectric vibrating plate is surface-flexural-vibrated in the thickness direction thereof with an AC signal applied between the main surface electrodes and the internal electrode, and a box having supporting portions on which the outer peripheral portions on the back side of the piezoelectric vibrating plate is supported, the piezoelectric vibrating plate having a protecting film substantially on the entire surface on the back-side only or on the front and back sides of the piezoelectric vibrating plate, and the protecting film being formed by applying a resin in a film-shape and hardening the resin, or by bonding an adhesive sheet and hardening the sheet, and the piezoelectric vibrating plate being warped on the front-side thereof by utilization of the hardening shrink stresses of the protecting films.

17 Claims, 11 Drawing Sheets

PIEZOELECTRIC ACOUSTIC TRANSDUCER

BACKGROUND OF THE INVENTION

1. Field of the Invention

The present invention relates to a piezoelectric type electroacoustic transducer, such as a piezoelectric receiver, a piezoelectric sounder, or other piezoelectric types of electroacoustic transducers.

2. Description of the Related Art

Conventionally, electroacoustic transducers such as piezoelectric sounders and piezoelectric receivers are used to generate alarm sounds or operating sounds in electronic devices or apparatuses, home electric appliances, portable telephones. In general, known electroacoustic transducers include a piezoelectric plate that is bonded to the surface of a metallic plate to provide a unimorph type vibrating plate, the peripheral portion of the metallic plate is fixed in a case, and an opening of the case is closed with a cover.

However, in the unimorph type vibrating plate, the piezoelectric plate, which is vibrated in the area expansion mode, is constrained by the metallic plate of which the area is not changed, such that the surface-flexural mode is caused. Therefore, the acoustic conversion efficiency is low. Furthermore, it is difficult to provide an electroacoustic transducer having a small size and a sound pressure characteristic with a low resonance frequency (e.g., see Japanese Unexamined Patent Application Publication No. 2001-95094 (Patent Document 1), Japanese Unexamined Patent Application Publication No. 2002-10393 (Patent Document 2), and Japanese Unexamined Patent Application Publication No. 61-30898 (Patent Document 3)).

Patent Document 1 discloses a piezoelectric vibrating plate having a high acoustic conversion efficiency. The piezoelectric vibrating plate is formed by laminating two or three layers of piezoelectric ceramics to form a laminate with an internal electrode being interposed between the layers, and forming main-surface electrodes on the front and back surfaces of the laminate. When an AC signal is applied between the main-surface electrodes and the internal electrode, the laminate is surface-flexural-vibrated. Thus, a sound is generated.

With the piezoelectric vibrating plate having the above-described structure, when an AC signal is applied between the main-surface electrodes and the internal electrode, the two vibrating regions (ceramic layers) arranged sequentially in the thickness direction are vibrated in opposite directions with respect to each other. Thus, the acoustic conversion efficiency of this piezoelectric vibrating plate is increased as compared to that of the unimorph type vibrating plate. This piezoelectric vibrating plate can generate a high sound pressure, and also, can be operated at a low frequency as compared to a unimorph type vibrating plate having the same size as the vibrating plate having the above-described structure.

The piezoelectric vibrating plate is primarily made of ceramics. Thus, the piezoelectric vibrating plate has a low drop-impact strength. Thus, according to the proposition by Patent Document 2, protecting films made of resin are provided on substantially the entire front and back surfaces a piezoelectric vibrating plate, such that the drop-impact strength is improved.

With the piezoelectric vibrating plates that are made of only piezoelectric ceramics as described above, the acoustic conversion efficiencies are high, but they have a very small thickness. Accordingly, the vibrating plates are often distorted or rippled. Moreover, the distortion does not occur in a constant direction. Therefore, when such a vibrating plate is supported in a box, the diameter of a circle which represents the node of the surface-flexural-mode is dispersed. Thus, the resonant frequency of the vibrating plate is substantially changed.

FIG. 10 shows a piezoelectric type electroacoustic transducer in which the piezoelectric vibrating plate is deflected. In FIG. 10, a piezoelectric vibrating plate A, a case B supporting the piezoelectric vibrating plate A, and a cover C are shown. The broken line in FIG. 11 represents the position of a node N of the surface-flexural-mode of the vibrating plate A.

When the piezoelectric vibrating plate A is warped upward, the distance L1 between the supporting points is increased as shown by the solid line in FIG. 10. On the other hand, when the piezoelectric vibrating plate A is warped downward, the distance L2 between the supporting points is decreased as shown by the broken line in FIG. 11. Each of the distances L1 and L2 between the supporting points is equivalent to the diameter L of a circle representing the surface-flexural-mode. Therefore, disadvantageously, when the plate is warped downward, the resonant frequency of the piezoelectric vibrating plate A is increased such that the sound pressure in a low frequency range is reduced.

The diameter of the circle representing the node of the surface-flexural-mode is dispersed depending upon the warping direction of the piezoelectric vibrating plate A. As a result, the resonant frequency of the vibrating plate is dispersed.

SUMMARY OF THE INVENTION

To overcome the problems described above, preferred embodiments of the present invention provide a piezoelectric type electroacoustic transducer in which the deflecting direction of the piezoelectric vibrating plate is controlled, the sound pressure is high at a low frequency, and the dispersion of the resonant frequency is greatly reduced.

According to a first preferred embodiment of the present invention, a piezoelectric type electroacoustic transducer includes a piezoelectric vibrating plate including a plurality of piezoelectric ceramic layers laminated to each other with an internal electrode being interposed between the piezoelectric ceramic layers, and main surface electrodes provided on the main surfaces on the front and back sides of the piezoelectric vibrating plate, whereby the piezoelectric vibrating plate is surface-flexural-vibrated in the thickness direction thereof with an AC signal applied between the main surface electrodes and the internal electrode, and a box including supporting portions on which the outer peripheral portions on the back side of the piezoelectric vibrating plate is supported, the piezoelectric vibrating plate having a protecting film provided on the substantially the entire back-side surface only or on the front- and back-side surfaces of the piezoelectric vibrating plate, the protecting film being formed by applying a paste resin in a film-shape and hardening the resin, or by bonding an adhesive sheet and hardening the sheet, and the piezoelectric vibrating plate being warped on only the front-side thereof by utilizing the hardening shrink stresses of the protecting films.

As described above, the protecting film is formed on the front and back side surfaces or on only the back-side surfaces of the piezoelectric vibrating plate so as to enhance the drop-impact strength. The warping direction of the vibrating plate is controlled by adjusting the thickness of the protecting film. The protecting film may be formed by applying a paste resin in a film-shape, and hardening the resin, or by bonding an adhesive sheet, and hardening the sheet. For example, for a thermosetting resin material used for the protecting film, the linear expansion coefficient is relatively large, and thus, the volume shrinkage of the resin, occurring when the resin is hardened at a high temperature and is restored to a room temperature, is larger than a piezoelectric material used for the vibrating plate. Therefore, a tensile force is generated in the plane of the protecting film. Thus, by adjustment of tensile forces (shrink stresses) applied to the protecting films on the front and back side surfaces so as to be different from each other, the vibrating plate is distorted such that the vibrating plate becomes concave on the side thereof where a larger tensile force is applied. The vibrating plate is warped on the upper side (front-side) thereof by the above-described distortion such that the outer peripheral portion on the back side of the vibrating plate is supported on the supporting portions provided in the box. Thus, the distance between the supporting points of the vibrating plate is increased. In other words, the diameter of a circle representing the node of the surface-flexural-mode (the area in which the vibrating plate can be freely moved during the surface-flexural-mode) is increased and is maintained approximately constant. Thus, the resonant frequency of the vibrating plate is reduced, and the sound pressure in a low frequency region is improved. Moreover, since warpage is provided in a constant direction at all times, the dispersion of the resonant frequency and the sound pressure is greatly reduced.

For the protecting film, room temperature curable resin and UV curable resins may be used in addition to thermosetting resins. The thermosetting resins have a large shrink stress, such that the piezoelectric vibrating plate is warped more efficiently.

Preferably, the protecting films are formed on both of the front and back side surfaces of the piezoelectric vibrating plate, and the protecting film on the back side has a greater thickness than the protecting film on the front side.

As described above, the thicknesses of the protecting films on the front and back side surfaces are preferably different from each other. The protecting film having a larger thickness is volume-shrunk to a greater degree that the protecting film having a smaller thickness, such that the vibrating plate is warped to be concave on the thicker protecting film side. That is, by setting the thickness of the back-side protecting film to be larger than that of the front-side protecting film, the shrink-stress of the back-side protecting film greater than that of the front-side protecting film, and thus, the piezoelectric vibrating plate is warped on the upper side.

Moreover, advantageously, the falling-impact strength of the piezoelectric vibrating plate is improved, since the protecting films are provided on the front and back side surfaces of the piezoelectric vibrating plate.

The protecting film may be provided on the back side only of the piezoelectric vibrating plate. In this case, no protecting film is provided on the front side surface of the piezoelectric vibrating plate. Thus, even if the thickness of the back-side protecting film is relatively small, the shrink stress causes the piezoelectric vibrating film to be warped on the front side thereof.

Moreover, in the case in which protecting films having approximately the same thicknesses are provided on the front and back surfaces of the piezoelectric vibrating plate, different shrink stresses can be generated in the protecting films on the front and back sides, such that the piezoelectric vibrating plate is warped on the front side thereof.

Preferably, the piezoelectric vibrating plate has a substantially rectangular shape, and the supporting portions in the box are provided in four locations in the inner peripheral portion of the box so as to support the four corners of the piezoelectric vibrating plate. Generally, piezoelectric vibrating plates are substantially circular or rectangular. A substantially rectangular vibrating plate has a larger displacement-volume than a substantially circular vibrating plate. Thus, the sound pressure of the substantially rectangular vibrating plate is greater than that of a circular vibrating plate. The substantially rectangular vibrating plate which is supported via the four corners thereof is surface-flexural-vibrated in which the node is represented by a circle circumscribing the vibrating plate, in contrast to a substantially rectangular vibrating plate supported at the center thereof. Therefore, with the vibrating plate supported on the four corners thereof, the resonance frequency is reduced as compared to a vibrating plate supported on the center thereof, even if these vibrating plates are the same sizes.

According to a second preferred embodiment of the present invention, a piezoelectric type electroacoustic transducer includes a piezoelectric vibrating plate including a plurality of piezoelectric ceramic layers laminated to each other with an internal electrode being interposed between the piezoelectric ceramic layers, and main surface electrodes provided on the front and back side main surfaces of the piezoelectric vibrating plate, whereby the piezoelectric vibrating plate is surface-flexural-vibrated in the thickness direction thereof with an AC signal applied between the main surface electrodes and the internal electrode, and a box including supporting portions on which the outer peripheral portions on the back side of the piezoelectric vibrating plate are supported, the piezoelectric vibrating plate is warped on the front-side thereof. In this case, the same advantages as those of the piezoelectric type electroacoustic transducer according to the first preferred of the present invention are obtained.

Preferably, the piezoelectric vibrating plate includes a protecting film on substantially the entire surface on the back-side only, or protecting films on substantially the entire front and back side surfaces of the piezoelectric vibrating plate.

Since the vibrating plate having an upward warp is provided, the electroacoustic transducer has greatly improved sound pressure in a low frequency range and less dispersion of the characteristics thereof.

Other features, elements, characteristics, steps and advantages of the present invention will become more apparent from the following detailed description of preferred embodiments with reference to the attached drawings.

DETAILED DESCRIPTION OF PREFERRED EMBODIMENTS

Figure 1:
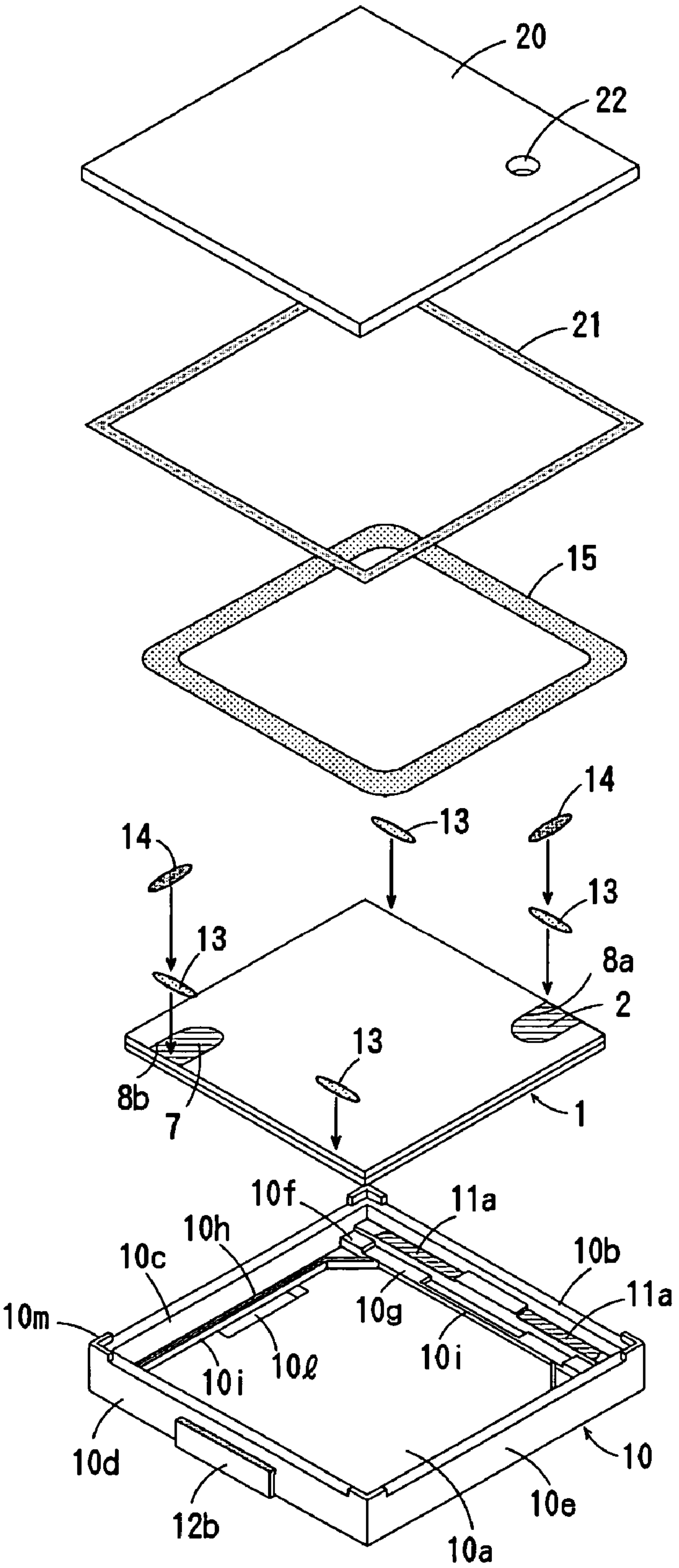
FIG. 1 is an exploded perspective view of a piezoelectric vibrating plate used in a piezoelectric type electroacoustic transducer according to a first preferred embodiment of the present invention.

FIG. 1 shows a surface mounting piezoelectric type electroacoustic transducer according to a first preferred embodiment of the present invention.

The electroacoustic transducer of this preferred embodiment is suitable for use as piezoelectric receiver in which the operating frequency ranges are wide. The electroacoustic transducer is provided with a piezoelectric vibrating plate 1 having a laminated structure, a case 10, and a lid 20. The case 10 and the lid 20 define a box.

Figure 2:
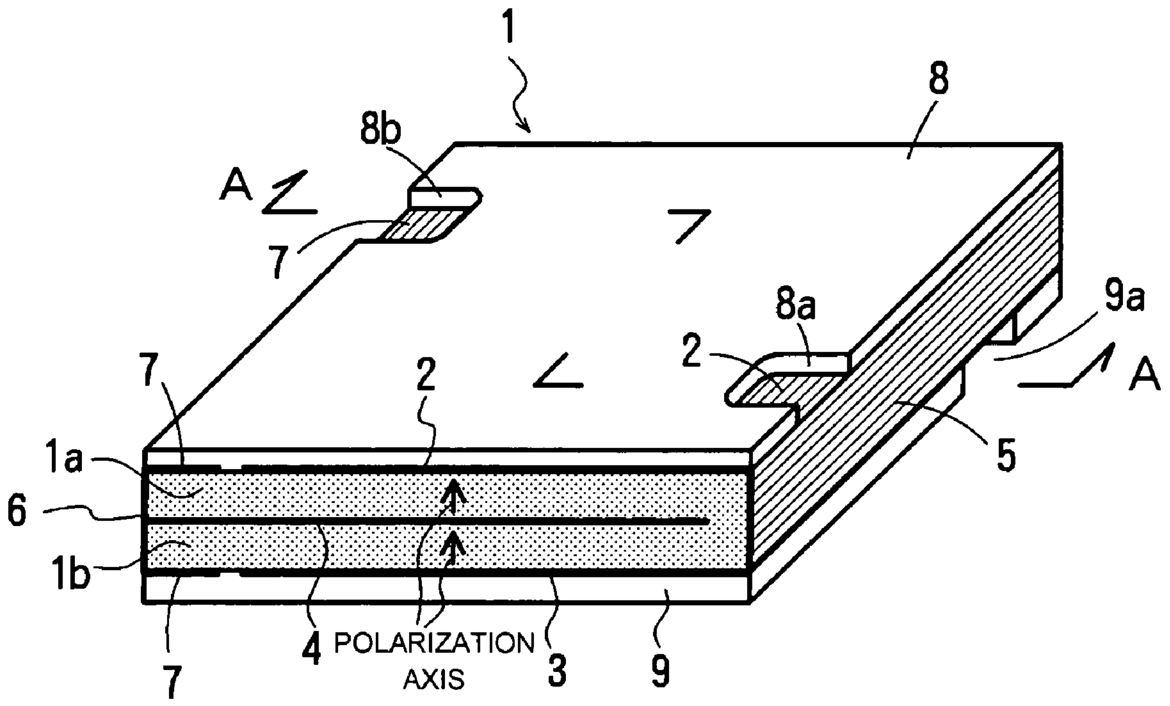
FIG. 2 is a perspective view of a piezoelectric vibrating plate for use in the piezoelectric type electroacoustic transducer of FIG. 1.
Figure 3:
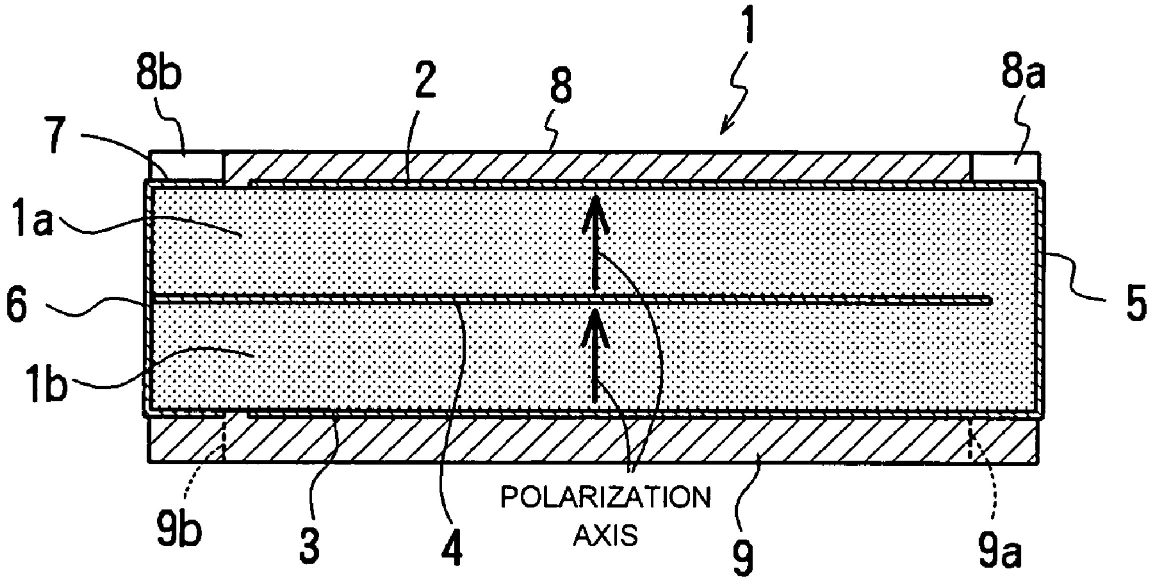
FIG. 3 is a cross-sectional view of the piezoelectric type electroacoustic transducer taken along line A—A in FIG. 2.

The vibrating plate 1 is preferably formed by laminating two piezoelectric ceramic layers 1*a* and 1*b* to each other as shown in FIGS. 2 and 3. Main-surface electrodes 2 and 3 are provided on the main surfaces on the front and back sides of the vibrating plate 1, respectively. An internal electrode 4 is provided between the ceramic layers 1*a* and 1*b*. The two ceramic layers 1*a* and 1*b* are polarized in the same thickness direction of the plate 1, as shown by bold line arrows in FIG. 2. The lengths of the sides of the main surface electrode 2 disposed on the front side and the lengths of the sides of the main surface electrode 3 disposed on the back side are slightly smaller than that of the vibrating plate 1, respectively, and the ends on one side of the main surface electrodes 2 and 3 are connected to an end surface electrode 5 provided on an end-face on one side of the vibrating plate 1. Thereby, the main surface electrodes 2 and 3 are connected to each other. The internal electrode 4 is arranged such that the main surface electrodes 2 and 3 are substantially symmetrical with respect to the internal electrode 4. One end of the internal electrode 4 is separated from the end surface electrode 5. The other end of the internal electrode 4 is connected to an end surface electrode 6 provided on the other end surface of the vibrating plate 1. Moreover, auxiliary electrodes 7 are provided on the other end portion on the front and back sides of the vibrating plate 1 so as to be connected to the end surface electrode 6.

The above-described vibrating plate 1 has a substantially square shape of which the length of one side of the respective ceramic layers 1*a* and 1*b* is preferably, for example, about 10 mm, and the thickness of the layer is preferably, for example, about 20 μm (total about 40 μm), and is made of a PZT type ceramic.

Figure 4:
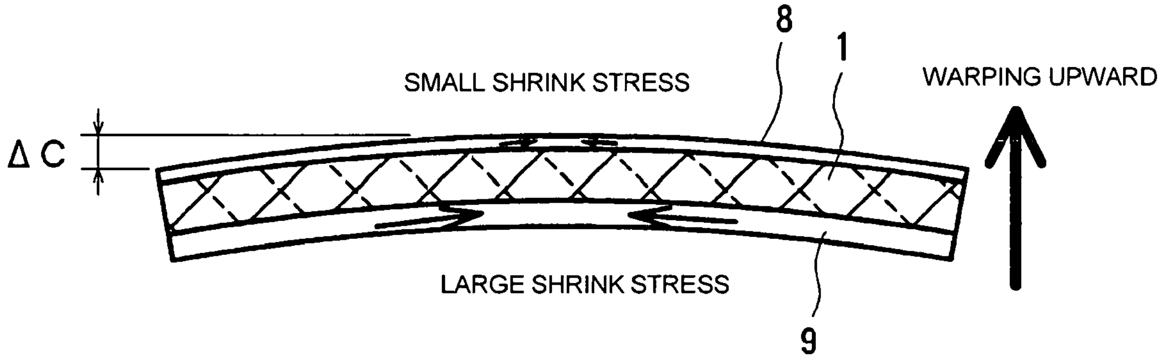
FIG. 4 is a cross-sectional view showing the warpage of a piezoelectric type electroacoustic transducer.

Protecting films 8 and 9 are arranged on the front and back side surfaces of the vibrating plate 1 so as to cover substantially the entire respective main surface electrodes 2 and 3. The protecting films 8 and 9 are arranged so as to prevent the vibrating plate 1 from being broken when it is dropped. The protecting films 8 and 9 are formed by coating a paste resin of a polyamide-imide type resin to form a film and heat-curing the resin. The protecting film 9 coating the main surface electrode 3 on the back side main surface of the vibrating plate 1 preferably has a larger thickness than the protecting film 8 coating the front side main surface electrode 2. Thereby, as shown in FIG. 4, the vibrating plate 1 is bent so as to be convex in the upper direction, i.e., is warped upwardly, due to the difference between the shrinking stresses of the protecting films 8 and 9 on the front and back sides which are generated at heat-curing. For example, for the vibrating plate 1 having a length of one side of about 10 mm in which the front-side protecting film 8 has a thickness of about 7 μm, and the back-side protecting film 9 has a thickness of about 15 μm, the warpage ΔC is about 0.1 mm.

As the protecting films 8 and 9, known thermosetting type adhesive sheets or adhesive films may also be used.

The protecting films 8 and 9 on the front and back sides are preferably provided with cuts 8*a* and 9*a* and 8*b* and 9*b*, which are provided in the vicinities to the corners of the vibrating plate 1 in the diagonal directions. The main-surface electrodes 2 and 3 are exposed through the cuts 8*a* and 9*a*. The auxiliary electrodes 7 are exposed through the cuts 8*b* and 9*b*. The cuts 8*a*, 8*b*, 9*a*, and 9*b* may be provided on one of the front and back sides of vibrating plate 1. In this example, the cuts 8*a*, 8*b*, 9*a*, and 9*b* are provided both of the front and back sides of the vibrating plate 1 so as to exhibit the same properties on the front and back sides of the vibrating plate 1.

Moreover, the auxiliary electrodes 7 are not necessarily configured in belt-shape patterns having the same widths, and may be provided only in locations which correspond to the cuts 8*b* and 9*b*, respectively.

The case 10 preferably has a substantially rectangular box shape, and includes a bottom wall 10*a* and four side walls 10*b* to 10*e* which are made of a resin material, as shown in FIGS. 5 to 8. As the resin material, heat-resistant resins such as LCP (liquid crystal polymer), SPS (syndiotactic polystyrene), PPS (polyphenylenesulfide), epoxy resins, and other suitable resin material are preferable. Bifurcated inner connecting portions 11*a* and 11*a* of a terminal 11, and bifurcated inner connecting portions 12*a* and 12*a* of a terminal 12 are exposed on the inner sides of the two opposed side-walls 10*b* and 10*d* of the four side walls 10*b* to 10*e*, respectively. The terminals 11 and 12 are formed in the case 10 by insert-molding. External connecting portions 11*b* and 12*b* of the terminals 11 and 12 are exposed outside the case 10, extend on the outer surfaces of the side walls 10*b* and 10*d*, and are bent onto the bottom surface of the case 10, respectively.

Supporting portions 10*f* are provided in the four corners on the inner side of the case 10 to support the vibrating plate 1 via the corners of the lower surfaces thereof. The supporting portions 10*f* are arranged so as to be lower than the exposed surfaces of the inner connecting portions 11*a* and 12*a* of the terminals 11 and 12, respectively. Thereby, when the vibrating plate 1 is disposed on the supporting portions 11*f*, the upper surface of the vibrating plate 1 is located slightly lower than the upper surfaces of the inner connecting portions 11*a* and 12*a* of the terminals 11 and 12, respectively.

Stands 10*g* are provided in the vicinities to the supporting portions 10*f*. The stands 10*g* are lower than the upper surfaces of the supporting portions 10*f* such that desired gaps D1 are provided between the upper surfaces of the stands and the lower surface of the vibrating plate 1, respectively. In particular, the gap D1 between the upper surface of each stand 10*g* and the lower surface of the vibrating plate 1 (i.e., the upper surface of each supporting portion 10*f*) is set to a size such that a first elastic adhesive 13, which will be described below, is prevented from flowing out through the gap, due to the surface tension of the first elastic adhesive. In this preferred embodiment, the gap D1 is preferably set to about 0.15 mm, for example.

Moreover, grooves 10*h* are provided in the periphery of the bottom wall 10*a* of the case 10, such that a second elastic adhesive 15 is filled into the grooves 10*h*. Flow-stopping walls 10*i* are provided along the grooves 10*h* on the inner side thereof. The flowing-out preventing walls 10*i* prevents the second elastic adhesive 15 from flowing onto the bottom 10*a*. The gap D2 between the upper surface of each wall 10*i* and the lower surface of the vibrating plate 1 (the upper surface of the supporting portion 10*f*) is set to a size such that flowing of the second elastic adhesive 15 in prevented due to the surface tension thereof. In this preferred embodiment, the gap D2 is set to about 0.20 mm, for example.

In this preferred embodiment, the bottom surface of each groove 10*h* is lower than the upper surface of the bottom wall 10*a*. The depth of the groove 10*h* is small enough that the groove 10*h* can be filled with a relatively small amount of the second elastic adhesive 15, and the resin 15 can be quickly extended in the periphery of the vibrating plate 1. More specifically, the height D3 from the bottom surface of the groove 10*h* to the lower surface of the vibrating plate 1 (i.e., the upper surface of the supporting portion 10*f*) is about 0.30 mm, for example. The grooves 10*h* and the walls 10*i* are provided in the peripheral portion of the bottom wall 10*a* excluding the stands 10*g*. The grooves 10*h* and the walls 10*i* are preferably continuously provided in the overall peripheral portion of the bottom wall 10*a* and extend along the peripheries of the stands 10*g* on the inner side.

Tapered protuberances 10*j* are provided on the inner surfaces of the side walls 10*b* to 10*e* of the case 10. The protuberances 10*j* guide the four sides of the piezoelectric vibrating plate 1. Two protuberances 10*j* are provided for each of the side walls 10*b* to 20*e*.

Concave portions 10*k* are provided in the upper edges of the inner surfaces of the side walls 10*b* to 10*e* of the case 10. The concave portions 10*k* prevent the second elastic adhesive from rising up along the wall surfaces.

Moreover, a first sound-emitting hole 101 is preferably provided in the bottom wall 10*a* near the side wall 10*e*.

Substantially L-shaped positioning convexities 10*m* are provided on the top surfaces of the corners of the side walls 10*b* to 10*e* of the case 10. The convexities 10*m* are fitted to the corners of the lid 20 and hold the lid 20. Tapered surfaces 10*n* for guiding the lid 20 are provided on the inner surfaces of the convexities 10*m*, respectively.

The vibrating plate 1 is placed in the case 10, and the corners of the vibrating plate 1 are supported by the supporting portions 10*f*. As described above, the vibrating plate 1 is bent to be convex in the upward direction. Thus, when the vibrating plate 1 is placed on the supporting portions 10*f*, the peripheral edges of the corners of the vibrating plate 1 comes into contact with the supporting portions 10*f*. Therefore, the distance between the supporting points is increased. The diameter of a circle representing the node of the surface-flexural-mode is increased. Thereby, the resonant frequency is reduced, and the sound pressure in a low frequency range greatly improved.

Figure 5:
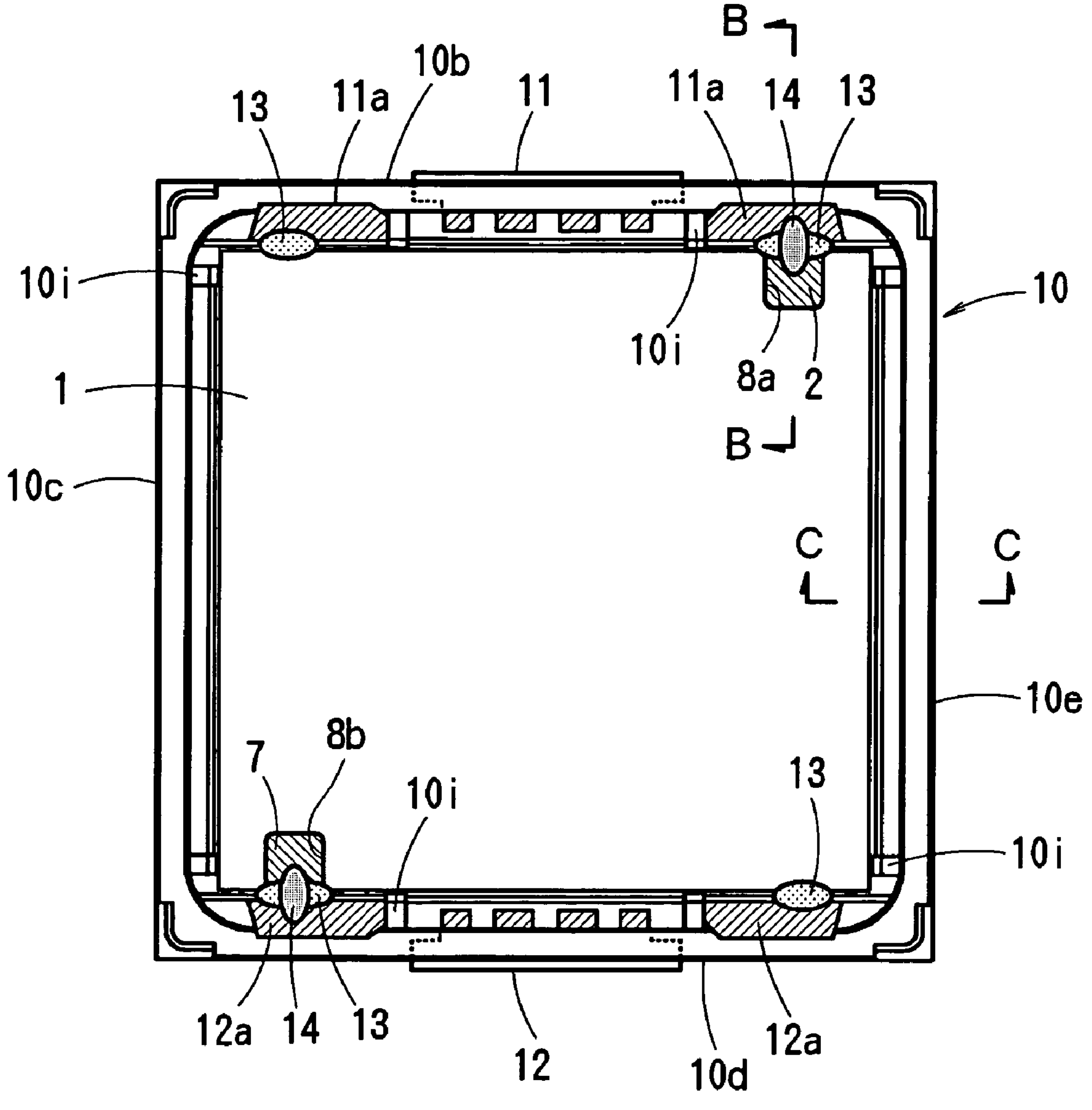
FIG. 5 is a plan view of the vibrating plate supported in a case (before a second elastic adhesive is applied)
Figure 6:
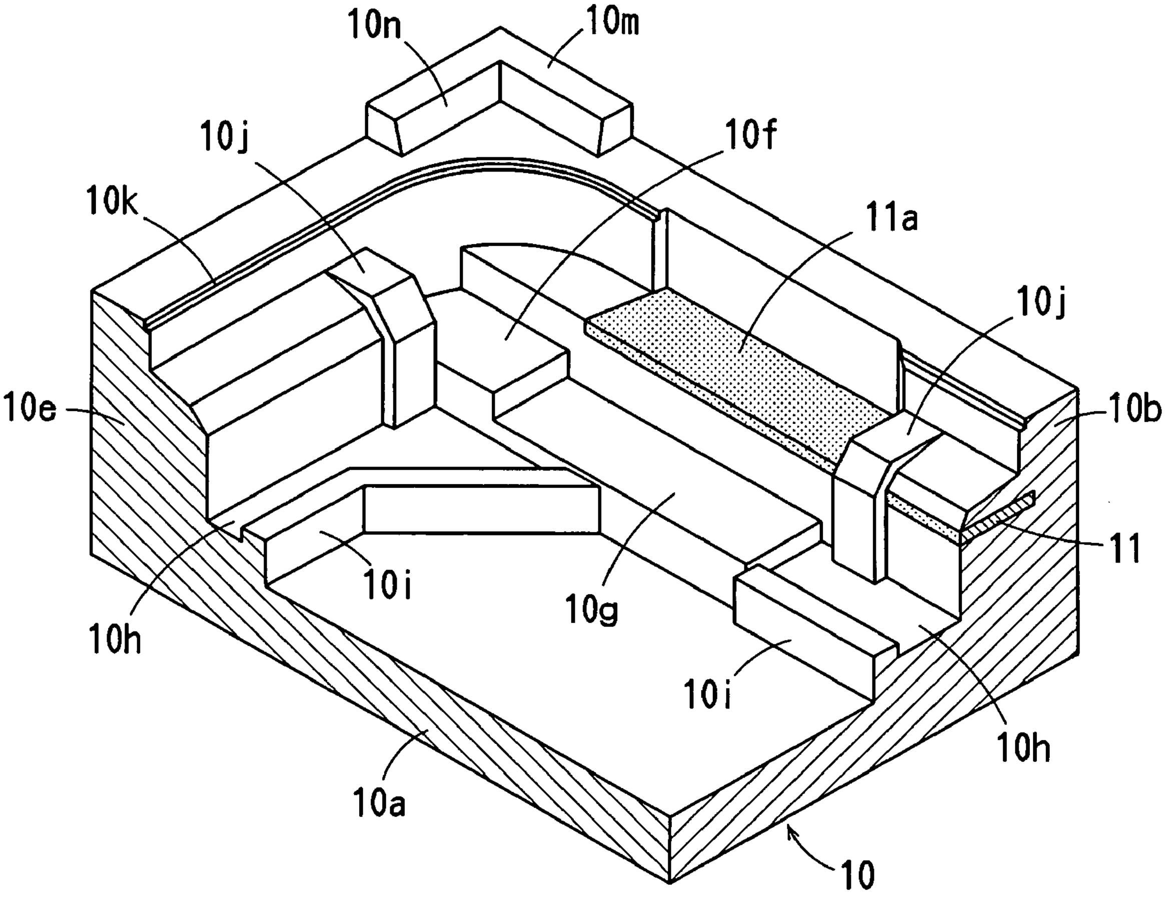
FIG. 6 is an enlarged perspective view of a corner of the case.
Figure 7:
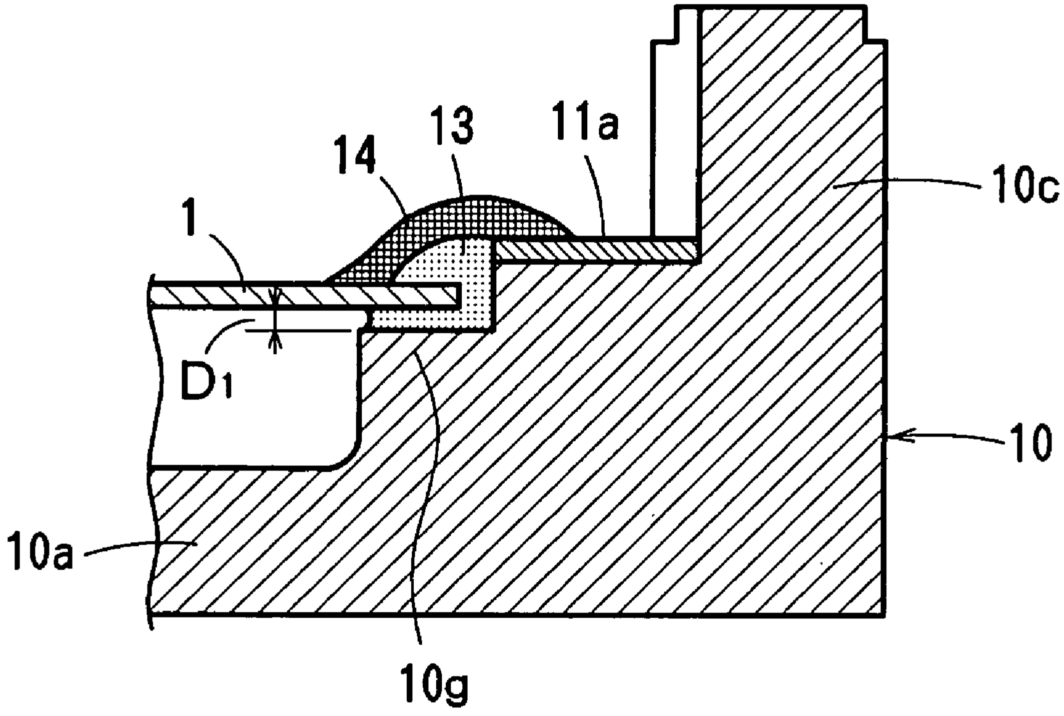
FIG. 7 is an enlarged cross-sectional view of the vibrating plate supported in the case taken along line B—B in FIG. 5.
Figure 8:
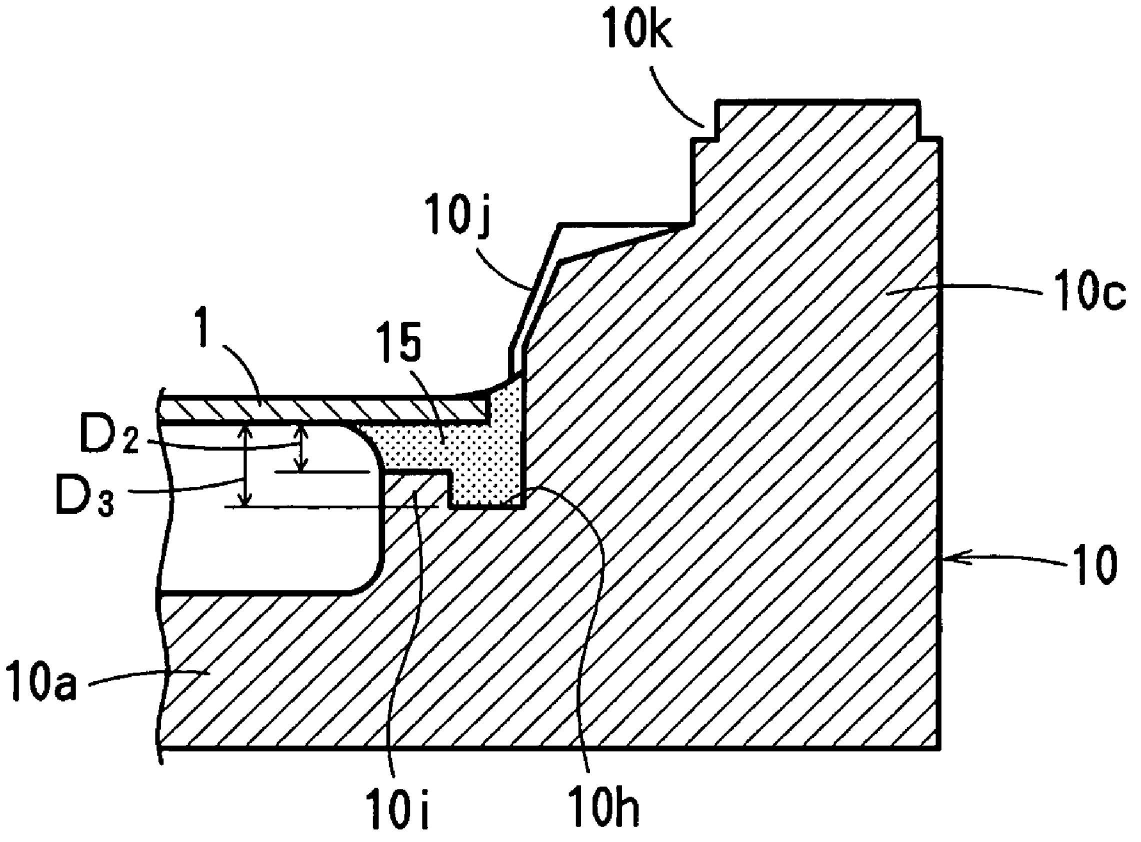
FIG. 8 is an enlarged cross-sectional view of the vibrating plate supported in the case taken along line C—C in FIG. 5.

After the vibrating plate 1 is placed in the case 10, the first elastic adhesive 13 is applied at the four locations shown in FIG. 5. Thus, the vibrating plate 1 is fixed to the inner connecting portions 11*a* of the terminal 11 and the inner connecting portions 12*a* of the terminal 12. In particular, the first elastic adhesive 13 is applied at the locations between the main surface electrode 2 exposed through the cut 8*a* and one inner connecting portion 11*a* of the terminal 11 and also between the auxiliary electrode 7 exposed through the cut 8*b* and one inner connecting portion 12*a* of the terminal 12, in which the cuts 8*a* and 8*b* are arranged on one diagonal line of the vibrating plate 1. Similarly, the first elastic adhesive 13 is applied at the remaining two locations opposed in the other diagonal line direction. In this case, the first elastic adhesive 13 is applied in an elliptic pattern extending along the sides 10*b* and 10*d* of the case 10, respectively. However, the coating-pattern is not restricted to the above-described ellipse. For the first elastic adhesive 13, for example, an adhesive having a relatively low Young's modulus after hardening, such as a urethane type adhesive having a Young's modulus of about $3.7\times10^6$ Pa, may be used. The first elastic adhesive 13, after coating, is heated so as to be hardened.

After the first elastic adhesive 13 is hardened, a conductive adhesive 14 is applied on the first elastic adhesive 13 in elliptic patterns or elongated patterns so as to intersect the patterns of the first elastic adhesive 13, respectively. The types of the conductive adhesive 14 are not particularly limited. In this preferred embodiment, as the adhesive 14, a urethane type conductive paste having a Young's modulus after curing of about $0.3\times10^9$ Pa is preferably used. The conductive adhesive 14, after it is applied, is heated so as to be cured. Thereby, the main surface electrode 2 is connected to the inner connecting portions 11*a* of the terminal 11, and the auxiliary electrode 7 is connected to the inner connecting electrodes 12*a* of the terminal 12. The coating-patterns of the conductive adhesive 14 are not restricted to the elliptical shape described above. The coating-patterns may have any suitable arrangement, provided that the patterns connect the main surface electrode 2 to the inner connecting portions 11*a* via the upper surfaces of the first elastic adhesive 13 and also connect the auxiliary electrode 7 to the inner connecting portions 12*a* via the upper surfaces of the first elastic adhesive 13. The first elastic adhesive is formed in an arch-shaped pattern. Accordingly, the conductive adhesive 14 has an arch-shape. Therefore, the conductive adhesive 14 avoids the shortest routes between the main surface electrode 2 and the inner connecting portion 11*a* (see FIG. 7). Thus, the shrink stresses, caused when the conductive adhesive 14 is hardened, are relaxed due to the presence of the first elastic adhesive 13. Thus, the influence of the shrink stress on the piezoelectric vibrating plate 1 is reduced.

After the conductive adhesive 14 is coated and hardened, a second elastic adhesive 15 is applied to fill the gap between the overall periphery of the vibrating plate 1 and the inner periphery of the case 10 so as to prevent air from leaking from the front side of the vibrating plate 1 to the back side thereof and vice versa. The second elastic adhesive 15 is coated in a ring-pattern and heated to be cured. As the second elastic adhesive 15, a thermosetting adhesive having a low Young's modulus after curing (e.g., about $3.0\times10^5$ Pa) is preferably used. In this preferred embodiment, a silicone type adhesive is preferably used.

When the second elastic adhesive 15 is applied, a portion of the adhesive may be raised up along the side walls 10*b* to 10*e* of the case 19 to adhere to the top surfaces of the side walls. In the case in which the second elastic adhesive 15 is a sealant having a releasing property such as a silicone type adhesive, the bonding strength between the lid 20 and the top surfaces of the side walls 10*b* to 10*e*, obtained when the lid 20 is bonded to the top surfaces in the subsequent process, is reduced. However, in this preferred embodiment, the concave portions 10_k_ for preventing the second elastic adhesive 15 from being raised up are provided on the upper edges of the inner surfaces of the side walls 10_b_ to 10_c_. Accordingly, the second elastic adhesive 15 is prevented from adhering to the top surfaces of the side walls 10_b_ to 10_e_.

As described above, after the vibrating plate 1 is fixed to the case 10, the lid 20 is bonded to the top surfaces of the side walls of the case 10 by an adhesive 21. The lid 20 has a substantially flat plate shape and is made of the same material as that for the case 10. The peripheral edge of the lid 20 is engaged with the tapered inner surfaces 10_n_ of the positioning convexities 10_m_ provided on the top surfaces of the side walls of the case 10. Thus, the lid 20 is accurately positioned. An acoustic space is provided between the lid 20 and the vibrating plate 1 by bonding the lid 20 to the case 10. A second sound-emitting hole 22 is provided in the lid 20.

Thus, a surface-mounting piezoelectric type electroacoustic transducer is produced.

According to the electroacoustic transducer of this preferred embodiment, an alternating voltage (AC signal or rectangular wave signal) is applied between the terminals 11 and 12, which causes the vibrating plate 1 to be surface-flexural-vibrated. A piezoelectric ceramic layer in which the polarization direction and the electric field direction are the same is contracted in the plane-direction. A piezoelectric ceramic layer in which the polarization direction and the electric field direction are opposite to each other is extended in the plane direction. As a whole, the vibrating plate 1 is bent in the thickness direction.

In this preferred embodiment, the vibrating plate 1 is a laminated structure made of ceramics. The two mode regions (ceramic layers) arranged sequentially in the thickness direction are vibrated in opposite directions. Thus, an increased displacement, that is, an increased sound pressure, is generated as compared to that of a unimorph type vibrating plate.

As described above, the vibrating plate 1 is set to be warped upward with respect to the supporting portions 20_f_, due to the protecting films 8 and 9 on the front and back sides. Thus, the peripheral edge of the vibrating plate 1 comes into contact with the supporting portions 20_f_. Therefore, the area (the diameter of a circle representing the node of surface-flexural mode) in which the vibrating plate 1 freely moves during the surface-flexural mode is kept constant. Moreover, the distance between the supporting points is maintained relatively large. Therefore, the resonant frequency is decreased, such that the sound pressure in a low frequency range is greatly improved. Thus, the dispersion of the sound pressure characteristic is greatly reduced.

Figure 9:
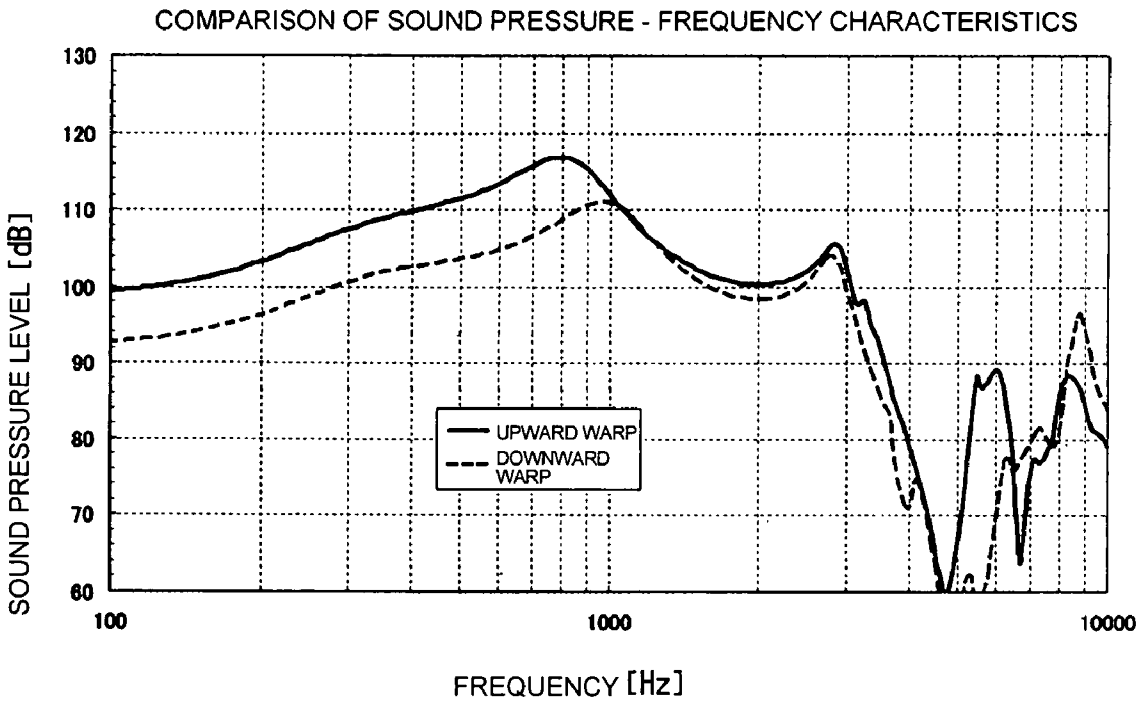
FIG. 9 is a graph showing the sound pressure—frequency characteristic of piezoelectric type electroacoustic transducers using a piezoelectric vibrating plate having an upward warp and a piezoelectric vibrating plate having a downward warp.
Figure 10:
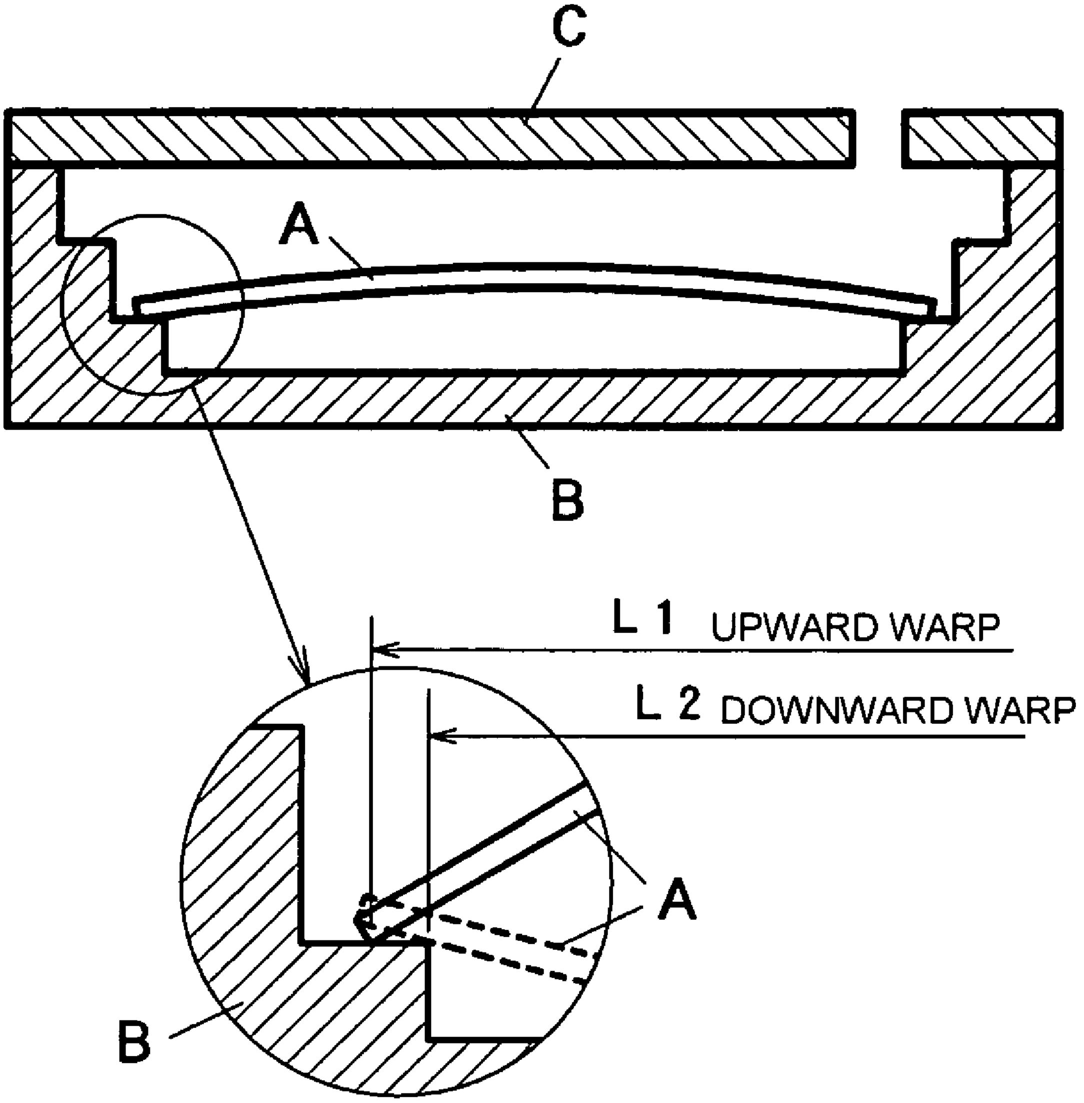
FIG. 10 PRIOR ART
FIG. 10 shows the structure of a piezoelectric type electroacoustic transducer using a warped piezoelectric vibrating plate.
Figure 11:
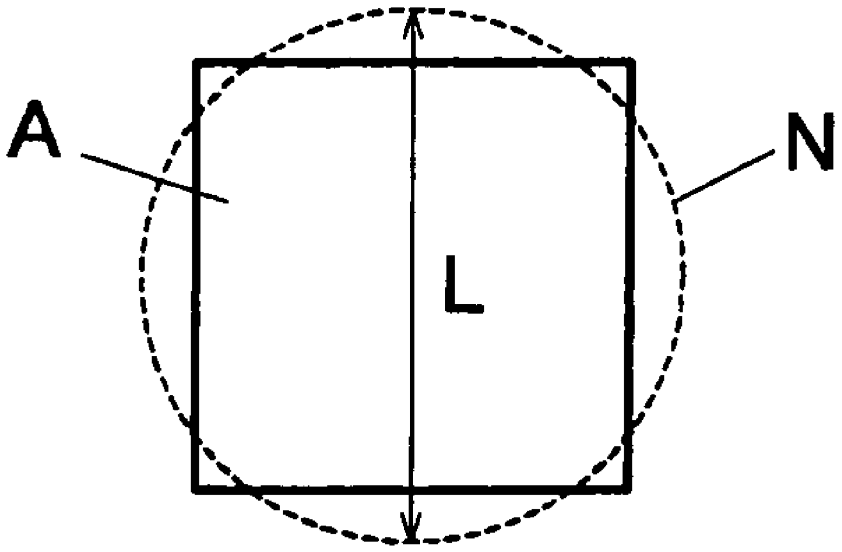
FIG. 11 PRIOR ART
FIG. 11 shows the position of a node of the surface-flexural-mode of a vibrating plate.

FIG. 9 shows, for comparison, the sound pressure characteristics of electroacoustic transducers using a piezoelectric vibrating plate having an upward warp and a piezoelectric vibrating plate having a downward warp.

As seen in FIG. 9, in the case in which the upward warp is provided, the sound pressure characteristic in a low frequency range of about 100 Hz to about 1000 Hz is improved as compared to that obtained when the downward warp is provided.

The present invention is not restricted to the above-described preferred embodiments. Various changes and modifications may be made in the invention without departing the sprit and scope thereof.

In the above-described preferred embodiments, the protecting films 8 and 9 are provided on the front and back side surfaces of the vibrating plate 1, and the thickness of the back-side protecting film 9 is greater than that of the front-side protecting film 8. Thus, an upward warp of the vibrating plate 1 is provided. Only the back-side protecting film 9 may be provided so as to exclude the front-side protecting film 8.

Moreover, the protecting films 8 and 9 may be provided on the front and back side surfaces of the vibrating plate 1, in which the hardening shrink stress of the back-side protecting film 9 is greater than that of the front-side protecting film 8. Thereby, an upward warpage of the vibrating plate 1 is provided. For example, materials for the protecting film 8 and 9 on the front and back side surfaces which are different from each other may be used. That is, materials which produce a linear expansion coefficient of about $1.0\times10^{-5}$ [1/K] to the front-side protecting film 8 and a linear expansion coefficient of about $1.0\times10^{-4}$[1/K] to the back-side protecting film 9 may be used. Moreover, for example, the hardening temperature for the front-side protecting film 8 may be about 60° C., while that for the back-side protecting film 9 is about 110° C.

The piezoelectric vibrating plate 1 of the above-described preferred embodiment is formed by laminating two piezoelectric ceramic layers. The vibrating plate 1 may be formed by laminating at least three piezoelectric ceramic layers.

The box according to the present invention is not restricted to one including the case 10 having a concave cross-section and the lid 20 bonded to the case 10 so as to cover the opening on the upper side of the case 10. The box according to preferred embodiments of the present invention may include a cap-shaped case having an opening on the lower side, and a base plate which is bonded to the lower-side of the case. The vibrating plate 1 is provided inside the case.

The present invention is not limited to the above-described preferred embodiments, but can be modified in the scope of the attached claims. Further, the technologies disclosed in the above-described preferred embodiments can be used in combination, as desired.

What is claimed is:

1. A piezoelectric type electroacoustic transducer comprising:

a piezoelectric vibrating plate including a plurality of piezoelectric ceramic layers laminated to each other with an internal electrode interposed between each of the plurality of piezoelectric ceramic layers, and main surface electrodes provided on front and back side main surfaces of the piezoelectric vibrating plate, whereby the piezoelectric vibrating plate is surface-flexural-vibrated in a thickness direction thereof with an AC signal applied between the main surface electrodes and the internal electrode; and a box including supporting portions on which the outer peripheral portions of the back side of the piezoelectric vibrating plate is supported, the piezoelectric vibrating plate having a protecting film provided on both of the front and back side surfaces of the piezoelectric vibrating plate, the protecting film being formed by applying a paste resin in a film-shape and hardening the resin, or by bonding an adhesive sheet and hardening the sheet, and the piezoelectric vibrating plate is warped on the front-side thereof by the hardening shrink stresses of the protecting films; wherein the protecting film on the back side surface has a thickness that is greater than that of the protecting film on the front side surface.

2. A piezoelectric type electroacoustic transducer according to claim 1, wherein the piezoelectric vibrating plate has a substantially rectangular shape, and the supporting portions of the box are provided in four positions in the inner peripheral portion of the box so as to support four corners of the piezoelectric vibrating plate.

3. A piezoelectric type electroacoustic transducer according to claim 1, further comprising end surface electrodes provided on end surfaces of said piezoelectric vibrating plate, wherein said internal electrode is electrically connected to one of said end surface electrodes.

4. A piezoelectric type electroacoustic transducer according to claim 1, wherein the piezoelectric vibrating plate has a substantially square shape, and the supporting portions of the box are provided in four positions in the inner peripheral portion of the box so as to support four corners of the piezoelectric vibrating plate.

5. A piezoelectric type electroacoustic transducer according to claim 1, wherein said protecting films are made of a paste resin which is coated on the piezoelectric vibrating plate.

6. A piezoelectric type electroacoustic transducer according to claim 1, wherein said protecting films include cuts at corners of the piezoelectric vibrating plate so as to expose the main surface electrodes.

7. A piezoelectric type electroacoustic transducer according to claim 1, wherein the box includes stands provided in the vicinities of the supporting portions, said stands being arranged so as to be lower than upper surfaces of the supporting portions such that gaps are provided between upper surfaces of the stands and the back side surface of the piezoelectric vibrating plate.

8. A piezoelectric type electroacoustic transducer according to claim 7, wherein an elastic adhesive is provided between the stands and the back side surface of the piezoelectric vibrating plate.

9. A piezoelectric type electroacoustic transducer according to claim 1, wherein grooves are provided between a periphery of a bottom wall of the box, and a second adhesive is provided in the grooves.

10. A piezoelectric type electroacoustic transducer comprising:

a piezoelectric vibrating plate including a plurality of piezoelectric ceramic layers laminated to each other with an internal electrode being interposed between each of the plurality of piezoelectric ceramic layers, and main surface electrodes provided on front and back side main surfaces of the piezoelectric vibrating plate, whereby the piezoelectric vibrating plate is surface-flexural-vibrated in the thickness direction thereof with an AC signal applied between the main surface electrodes and the internal electrode; and a box including supporting portions on which the outer peripheral portions on the back side of the piezoelectric vibrating plate is supported; wherein the piezoelectric vibrating plate is warped on the front-side thereof;

the piezoelectric vibrating plate includes protecting films provided on substantially the entire front and back side surfaces of the piezoelectric vibrating plate; and the protecting film on the back side surface has a thickness that is greater than that of the protecting film on the front side surface.

11. A piezoelectric type electroacoustic transducer according to claim 10, wherein the piezoelectric vibrating plate has a substantially rectangular shape, and the supporting portions of the box are provided in four positions in the inner peripheral portion of the box so as to support four corners of the piezoelectric vibrating plate.

12. A piezoelectric type electroacoustic transducer according to claim 10, wherein the piezoelectric vibrating plate has a substantially square shape, and the supporting portions of the box are provided in four positions in the inner peripheral portion of the box so as to support four corners of the piezoelectric vibrating plate.

13. A piezoelectric type electroacoustic transducer according to claim 10, wherein said protecting films are made of a paste resin which is coated on the piezoelectric vibrating plate.

14. A piezoelectric type electroacoustic transducer according to claim 10, wherein said protecting films include cuts at corners of the piezoelectric vibrating plate so as to expose the main surface electrodes.

15. A piezoelectric type electroacoustic transducer according to claim 10, wherein the box includes stands provided in the vicinities of the supporting portions, said stands being arranged so as to be lower than upper surfaces of the supporting portions such that desired gaps are provided between upper surfaces of the stands and the back side surface of the piezoelectric vibrating plate.

16. A piezoelectric type electroacoustic transducer according to claim 15, wherein an elastic adhesive is provided between the stands and the back side surface of the piezoelectric vibrating plate.

17. A piezoelectric type electroacoustic transducer according to claim 10, wherein grooves are provided between a periphery of a bottom wall of the box, and a second adhesive is provided in the grooves.

* * * * *